(12) United States Patent
Bhatia et al.

(10) Patent No.: US 10,691,536 B2
(45) Date of Patent: Jun. 23, 2020

(54) METHOD TO SELECT FLASH MEMORY BLOCKS FOR REFRESH AFTER READ OPERATIONS

(71) Applicant: SK Hynix Inc., Gyeonggi-do (KR)

(72) Inventors: Aman Bhatia, San Jose, CA (US); Fan Zhang, San Jose, CA (US); Chenrong Xiong, San Jose, CA (US); Naveen Kumar, San Jose, CA (US); Yu Cai, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 92 days.

(21) Appl. No.: 15/981,648

(22) Filed: May 16, 2018

(65) Prior Publication Data
US 2019/0095280 A1    Mar. 28, 2019

Related U.S. Application Data

(60) Provisional application No. 62/562,186, filed on Sep. 22, 2017.

(51) Int. Cl.
| | |
|---|---|
| *G06F 11/10* | (2006.01) |
| *G11C 16/26* | (2006.01) |
| *G11C 29/52* | (2006.01) |
| *G11C 11/56* | (2006.01) |
| *G11C 29/42* | (2006.01) |
| *G11C 16/34* | (2006.01) |
| *G11C 29/20* | (2006.01) |

(Continued)

(52) U.S. Cl.
CPC ...... *G06F 11/1068* (2013.01); *G06F 11/1072* (2013.01); *G11C 11/5628* (2013.01); *G11C 11/5642* (2013.01); *G11C 16/26* (2013.01); *G11C 16/3427* (2013.01); *G11C 29/20* (2013.01); *G11C 29/42* (2013.01); *G11C 29/4401* (2013.01); *G11C 29/52* (2013.01); *G11C 16/10* (2013.01); *G11C 2211/5644* (2013.01)

(58) Field of Classification Search
None
See application file for complete search history.

(56) References Cited

U.S. PATENT DOCUMENTS 9,190,160 B2 * 11/2015 Ok .................. G11C 16/26
9,411,669 B2 *  8/2016 Reddy .............. G11C 16/349
(Continued)

*Primary Examiner* — Phung M Chung
(74) *Attorney, Agent, or Firm* — Kilpatrick Townsend & Stockton LLP

(57) ABSTRACT

A system includes a plurality of memory cells. Each memory cell is programmed to a data state corresponding to one of multiple cell programmed voltages. The memory cells are read to determine a programmed data state of each memory cell. Error correction decoding is performed to determine a corrected data state of each memory cell. The corresponding cell levels, or programmed voltages, are determined based on the programmed data state and the corrected data state. A first error count represents a total number of error cells that have a higher cell level for the corrected data state than the programmed data state. A second error count represents a total number of error cells that have a lower cell level for the corrected data state than the programmed data state. The system is configured to perform a memory operation based on the first error count and the second error count.

18 Claims, 13 Drawing Sheets

(51) Int. Cl.
*G11C 29/44* (2006.01)
*G11C 16/10* (2006.01)

(56) References Cited

U.S. PATENT DOCUMENTS

| | | |
|---|---|---|
| 10,020,072 B2 * | 7/2018 | Li ............................ A47L 19/04 |
| 10,147,500 B2 * | 12/2018 | Cai ........................ G11C 16/26 |
| 2015/0339188 A1 * | 11/2015 | Hu ....................... G06F 11/1072 |
| | | 714/704 |
| 2016/0365158 A1 | 12/2016 | Yang |
| 2017/0177425 A1 | 6/2017 | Jei et al. |
| 2018/0047456 A1 | 2/2018 | Zhang et al. |
| 2019/0066809 A1 | 2/2019 | Kumar et al. |

* cited by examiner

METHOD TO SELECT FLASH MEMORY BLOCKS FOR REFRESH AFTER READ OPERATIONS

CROSS-REFERENCES TO RELATED APPLICATIONS

The present application claims priority to Provisional Application No. 62/562,186 entitled "A METHOD TO SELECT FLASH MEMORY BLOCKS FOR REFRESH AFTER READ OPERATIONS," filed Sep. 22, 2017, which is assigned to the assignee hereof and expressly incorporated by reference herein in its entirety.

BACKGROUND OF THE INVENTION

The present invention relates generally to methods and apparatus for storage devices, and specifically to improving performance of non-volatile memory devices.

Solid-state memory is ubiquitously used in a variety of electronic systems including, for example, consumer electronic devices (e.g., cellular phones, cameras, computers, etc.) and in enterprise computing systems (e.g., hard drives, random access memory (RAM), etc.). Solid-state memory has gained popularity over mechanical or other memory storage techniques due to latency, throughput, shock resistance, packaging, and other considerations. Among these non-volatile memory devices, NAND flash memory devices are popular due to low manufacturing cost for a high degree of integration.

Data stored in solid-state memory devices may degrade over time. For example, read disturb is a type of degradation that is introduced during the process of reading solid state storage (e.g., NAND Flash). During a read, the control gates of all cells in the selected block (other than the cells being read) are biased to a voltage which exceeds the maximum voltage that any cell in the block may be written to. In doing so, these cells are placed into the pass state, in which they act as short-circuits, thus isolating only the cells which are being read. An undesirable byproduct of this biasing, however, is the application of additional electrons to the floating-gates of these cells. These unintentional and additional charges can change the cell voltage and is referred to as read disturb.

When a large number of read-operations are performed on a flash memory block, the controller may decide to perform background read operations on various pages in that block to determine the "health" of the block, as measured by the number of bit-errors in the page as reported by the ECC decoder. The larger the number of bit-errors, the worse the health of the block. When the number of bit-errors exceeds a pre-determined threshold, the read-reclaimed operation is performed on the block.

BRIEF SUMMARY OF THE INVENTION

Read-reclaim operations can increase errors caused by read disturb and reduce the endurance of the flash memory. Therefore, it is desirable to reduce read-reclaim as much as possible.

In some embodiments, a method is provided to determine if the read-reclaim operation is required. Instead of making the decision to perform read-claim based only on the number of bit-errors in the page-read, the method also takes into consideration the number of cell-errors in the direction of increasing cell-level e+ and the number of cell-errors in the direction of decreasing cell-levels e−. In some cases, the threshold-voltage used for read-operations may not be optimal, the difference between e+ and e− may be large. Further, additional read-disturb stress is expected to increase e+ and decrease e−; the metric that takes these factors into account can detect whether read-reclaim is necessary with better accuracy. The method can predict if future read operations will cause the number of errors to decrease, thereby avoiding unnecessary read-reclaim operations and enhancing the endurance of the solid-state drive.

According to some embodiments, a system includes a plurality of memory cells. Each memory cell is programmed to a data state corresponding to one of multiple cell programmed voltages. The memory cells are read to determine a programmed data state of each memory cell. Error correction decoding is performed to determine a corrected data state of each memory cell. The corresponding cell programmed voltages are determined based on the programmed data state and the corrected data state. A first error count represents a total number of error cells that have a higher cell programmed voltage for the corrected data state than the programmed data state. A second error count represents a total number of error cells that have a lower cell programmed voltage for the corrected data state than the programmed data state. The system is configured to perform a memory operation based on the first error count and the second error count.

According to some embodiments, a non-volatile data storage device includes memory cells arranged in blocks and a memory controller coupled to the memory cells for controlling program and read operations of the memory cells. Each memory cell is programmed to a data state corresponding to one of multiple cell programmed voltages (PVs) from PV0 to PVN, where PV0<PV1< . . . <PVN, N being an integer. The memory controller is configured to perform a read reclaim operation as follows. The memory controller selects a block of memory cells, reads multiple memory cells in the block to determine a programmed data state of each memory cell, and performs error correction decoding of the multiple memory cells to determine a corrected data state of each memory cell. For each memory cell, the memory controller determines a read programmed voltage (PV-r) corresponding to the programmed data state determined by the read operation, and determines a corrected programmed voltage (PV-c) corresponding to the data state determined by the error correction decoding. The memory controller is configured to identify a plurality of error cells that have errors and determine a total number of error cells. The memory controller determines a first error count that represents a total number of error cells that have a higher read programmed voltage (PV-r) than corrected programmed voltage (PV-c). The memory controller also determines a second error count that represents a total number of error cells that have a lower read programmed voltage (PV-r) than corrected programmed voltage (PV-c). Further, the memory controller is also configured to determine if the first error count is higher than the second error count and determine if the total number of error cells is higher than a threshold error count. Upon determining that the first error count is higher than the second error count and the total number of error cells is higher than a threshold error count, the memory controller performs a read reclaim operation to the block of memory cells.

In an embodiment of the above device the read reclaim operation comprises copying valid values from the plurality of the memory cells to another plurality of memory cells.

In another embodiment, each memory cell is configured to store two binary bits of data and has four data states, 11, 01, 00, and 10 corresponding to four cell programmed voltages PV0-PV3, where PV0<PV1<PV2<PV3.

In another embodiment, each memory cell is configured to store three binary bits of data and has eight data states, 111, 011, 001, 000, 010, 110, 100, and 101 corresponding to four cell programmed voltages PV0-PV7, where PV0<PV1<PV2<PV3<PV4<PV5<PV6<PV7.

In another embodiment, the memory controller is configured to read multiple memory cells that are coupled to a word line in the block to determine a data state of each of the multiple memory cells.

In another embodiment, the memory controller is configured to identify a plurality of error cells by comparing, for each memory cell, the read programmed voltage (PV-r) with the corrected programmed voltage (PV-c).

According to some embodiments, a system includes memory cells arranged in blocks; and a memory controller coupled to the memory cells for controlling program and read operations of the memory cells. The memory controller is configured to identify a plurality of error cells that have errors and determine a total number of error cells. The memory controller is also configured to determine a first error count e+ that represents a number of cell-errors in the direction of increasing cell-level and a second error count e− that represents a number of cell-errors in the direction of decreasing cell-levels. The memory controller is configured to perform a memory operation based on the first error count and the second error count.

According to some embodiments, a system includes memory cells arranged in blocks; and a memory controller coupled to the memory cells for controlling program and read operations of the memory cells. Each memory cell is programmed to a data state corresponding to one of multiple cell programmed voltages (PVs) from PV0 to PVN, where PV0<PV1< . . . <PVN, N being an integer. The memory controller is configured to select a block of memory cells, read multiple memory cells in the block to determine a programmed data state of each memory cell, and perform error correction decoding of the multiple memory cells to determine a corrected data state of each memory cell. For each memory cell, the memory controller determines a read programmed voltage (PV-r) corresponding to the programmed data state determined by the read operation, and determines a corrected programmed voltage (PV-c) corresponding to the data state determined by the error correction decoding. The memory controller identifies a plurality of error cells that have errors and determines a total number of error cells. Further, a first error count and a second error count are determined. The first error count represents a total number of error cells that have a higher read programmed voltage (PV-r) than corrected programmed voltage (PV-c), and the second error count that represents a total number of error cells that have a lower read programmed voltage (PV-r) than corrected programmed voltage (PV-c). The memory controller is configured to perform a memory operation based on the first error count and the second error count.

In an embodiment of the above system, the memory cells are configured such that the cell programmed voltages (PVs) are increased by read disturb.

In another embodiment, the memory cells are configured such that the first error count is increased by read disturb and the second error count is decreased by read disturb.

In another embodiment, the memory controller is configured to identify a plurality of error cells by, for each memory cell, comparing the read programmed voltage (PV-r) with the corrected programmed voltage (PV-c).

In another embodiment, the memory controller is further configured to determine if the first error count is higher than the second error count, and determine if the total number of error cells is higher than a threshold error count. Upon determining that the first error count is higher than the second error count and the total number of error cells is higher than a threshold error count, the memory controller performs a read reclaim operation of the selected block.

In another embodiment, the read reclaim operation comprises copying valid values from the plurality of the memory cells to another plurality of memory cells.

According to some embodiments, a method is provided for controlling a storage system. The storage system includes a plurality of memory cells arranged in blocks and a memory controller coupled to the plurality of memory cells for controlling data write and read in the plurality of memory cells. The method includes selecting a block of memory cells, wherein each memory cell is programmed to a data state corresponding to one of multiple cell programmed voltages (PVs) from PV0 to PVN, where PV0<PV1< . . . <PVN, N being an integer. The method includes reading multiple memory cells in the block to determine a programmed data state of each memory cell, and performing error correction decoding of the multiple memory cells to determine a corrected data state of each memory cell. The method includes, for each memory cell, determining a read programmed voltage (PV-r) corresponding to the programmed data state determined by reading the memory cell, and determining a corrected programmed voltage (PV-c) corresponding to the data state determined by the error correction decoding. The method also includes identifying a plurality of error cells that have errors and a total number of error cells. Further, a first error count and a second error count are determined. The first error count represents a total number of error cells that have a higher read programmed voltage (PV-r) than corrected programmed voltage (PV-c), and the second error represents a total number of error cells that have a lower read programmed voltage (PV-r) than corrected programmed voltage (PV-c). The method further includes performing a memory operation based on the first error count and the second error count.

DETAILED DESCRIPTION OF THE INVENTION

Figure 1:
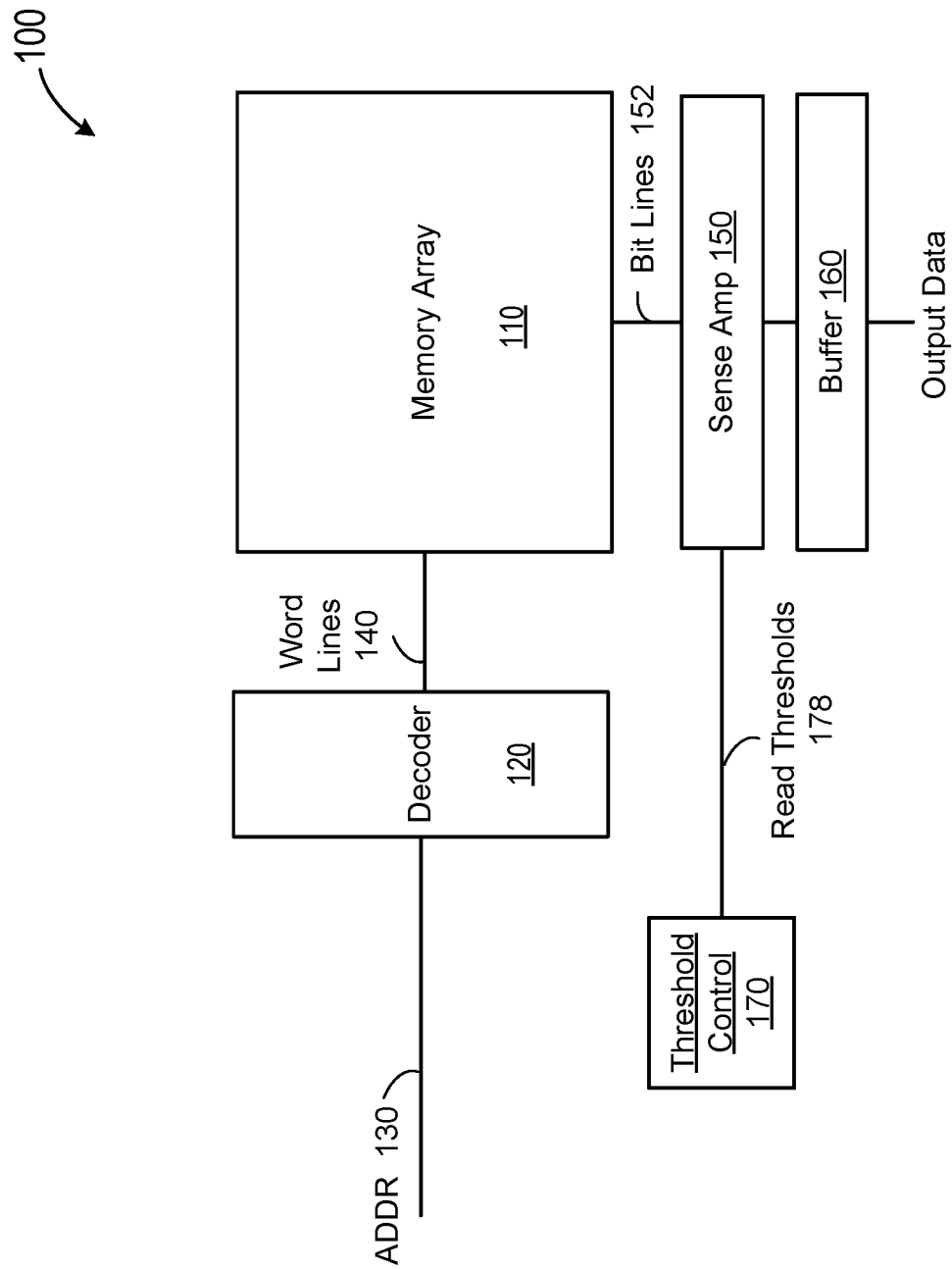
FIG. 1 is a simplified block diagram of a memory device according to some embodiments of the present invention.

FIG. 1 is a simplified block diagram of a memory device according to some embodiments of the present invention. In this example, a flash memory device 100 includes a memory cell array 110 having a plurality of non-volatile memory cells. In some embodiments, the memory cells are arranged in a plurality of memory blocks. Each memory block can include multiple non-volatile memory cells, each memory block being associated with a corresponding address. Memory device 100 also includes a decoder 120, for example a row decoder. In an example, decoder 120 receives a command for a memory operation with an address ADDR 130, e.g., a read command with a read address. The address 130 can be a logic block address. In an embodiment, the memory operations, such as read, write, erase, etc., are directed to a memory block, for example, a page or a sector. Depending on the embodiment, a page or a sector can be 0.5 Kbytes to 4 Kbytes, or a block of a different size. In this case, decoder 120 produces word lines (WL) 140 based on information on ADDR 130 for selecting a memory block, which can be a row of memory cells coupled to the selected word line A sense amplifier block 150 is coupled to memory cell array 10 through bit lines 152. A buffer block 160 is coupled to sense amplifier block 150 and provides output data to an external device. In a read operation, sense amplifier block 150 senses the data stored in each memory cell of the memory cell array 110 and provides the data to buffer block 160. In a write or program operation, buffer block 160 presents the data to be written or programmed to the memory array 110.

During a memory read operation, the charges in a non-volatile memory cell selected by a word line are read out. Depending on the charges stored in a memory cell, its cell threshold voltage can vary. A read voltage higher than cell threshold voltage can be used to determine the data stored in the memory cell. In some embodiments, each of the non-volatile memory cells can be a multilevel memory cell, and multiple threshold voltages are used to determine the data state of the memory cell, as represented by a bit pattern. In these cases, a threshold control circuit 170, which provides read thresholds 178, can be used to control the threshold voltages.

In multilevel memory cells, a data state is assigned to a specific range of threshold voltages (Vt), or programmed voltages (PV), stored on the memory cell. Single level memory cells (SLC) store a single binary digit (e.g., bit) of data on each memory cell. Multilevel memory technology permits the storage of two or more binary digits per cell (e.g., 2, 4, 8, 16 bits).

Figure 2:
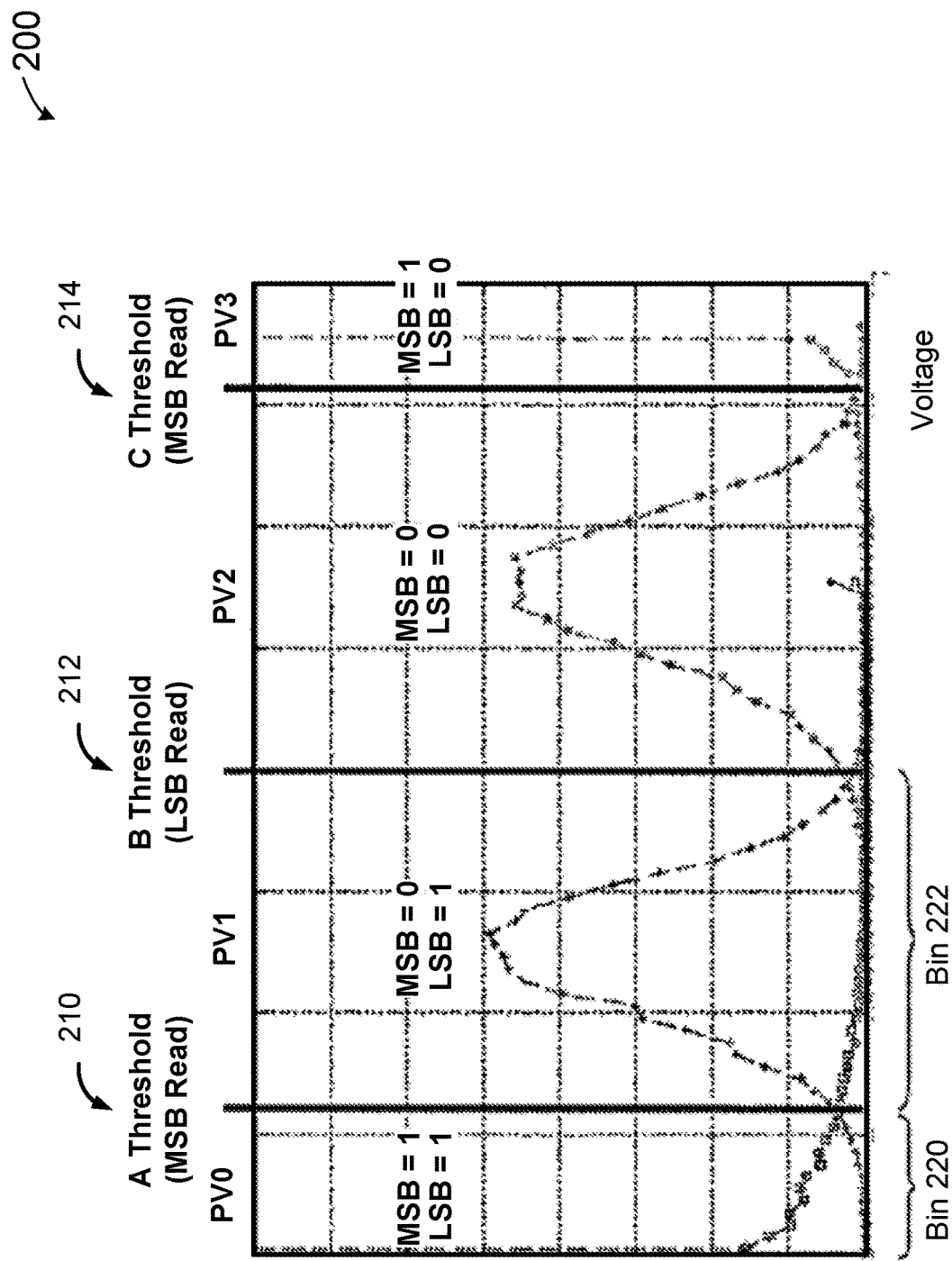
FIG. 2 is a diagram illustrating an example distribution of cell voltages in a group of cells in a 2-bit multi-level cell (MLC) system.

FIG. 2 is a diagram illustrating a plot 200 of the distribution of cell voltages in a group of cells in a 2-bit multi-level cell (MLC) system. FIG. 2 shows each cell is configured to store two bits of data: a most significant bit (MSB) and a least significant bit (LSB). In order to represent four data states of two bits, a cell may be programmed to one of four ranges of cell threshold voltages Vt, also referred to as cell programmed voltage (PV). In FIG. 2, ranges of programmed voltages, PV0, PV1, PV2, and PV3, represent four data states corresponding to a bit pattern of two bits. As an example, if the cell voltage stored on the cell is within the programmed voltage range PV0, the cell represents a logical "11" data state and is sometimes considered the erased state of the cell. If the voltage is within the programmed voltage range PV1, the cell represents a logical "01" data state. A voltage in the programmed voltage range PV1 would indicate that the cell represents a logical "00" data state. A voltage in the programmed voltage range PV1 would indicate that the cell represents a logical "10" data state.

As shown in FIG. 2, when a cell is read, three thresholds are used: A threshold 210, B threshold 212, and C threshold 214. The A and C thresholds are used to read the MSB. If the cell voltage stored by the cell is less than A threshold 210 or is greater than C threshold 214, then the MSB is read as a 1. If the cell voltage is between A threshold 210 and C threshold 214, then the MSB is read as a 0. Similarly, the B threshold is used to read the LSB. If the cell voltage stored by the cell is less than B threshold 212, then the LSB is read as a 1. If the cell voltage stored by the cell is greater than B threshold 212, then the LSB is read as a 0. In some other embodiments, the LSB and MSB may be swapped and/or some other bit mapping may be used.

In an ideal device, the distribution of cell voltages of the cells would be in four non-overlapping groups. However, due to variations in cell structures and/or operations, the cell voltage distribution can deteriorate. For example, read disturb noise can affect cell voltages. In FIG. 2, consider a cell which has a voltage just less than A threshold 210 before read disturb noise is added to that cell. With read disturb noise, the voltage of the cell can be pushed over the A threshold such that that cell would now be in bin 222 and not bin 220. In comparing the LSB and MSB values of bins 120 and bin 122, the LSB values are the same. However, the MSB value is different for cells in bin 120 compared to bin 122. Therefore, under this bit mapping, the MSB will be more useful in detecting read disturb noise associated with lower cell voltage levels.

Although some embodiments described herein show 2-bit, MLC examples, the techniques described herein are applicable to solid state systems which store any number of bits. For example, the techniques described herein work with 1-bit single-level cell (SLC) systems as well as 3-bit tri-level cell (TLC) systems, and so on.

Figure 3:
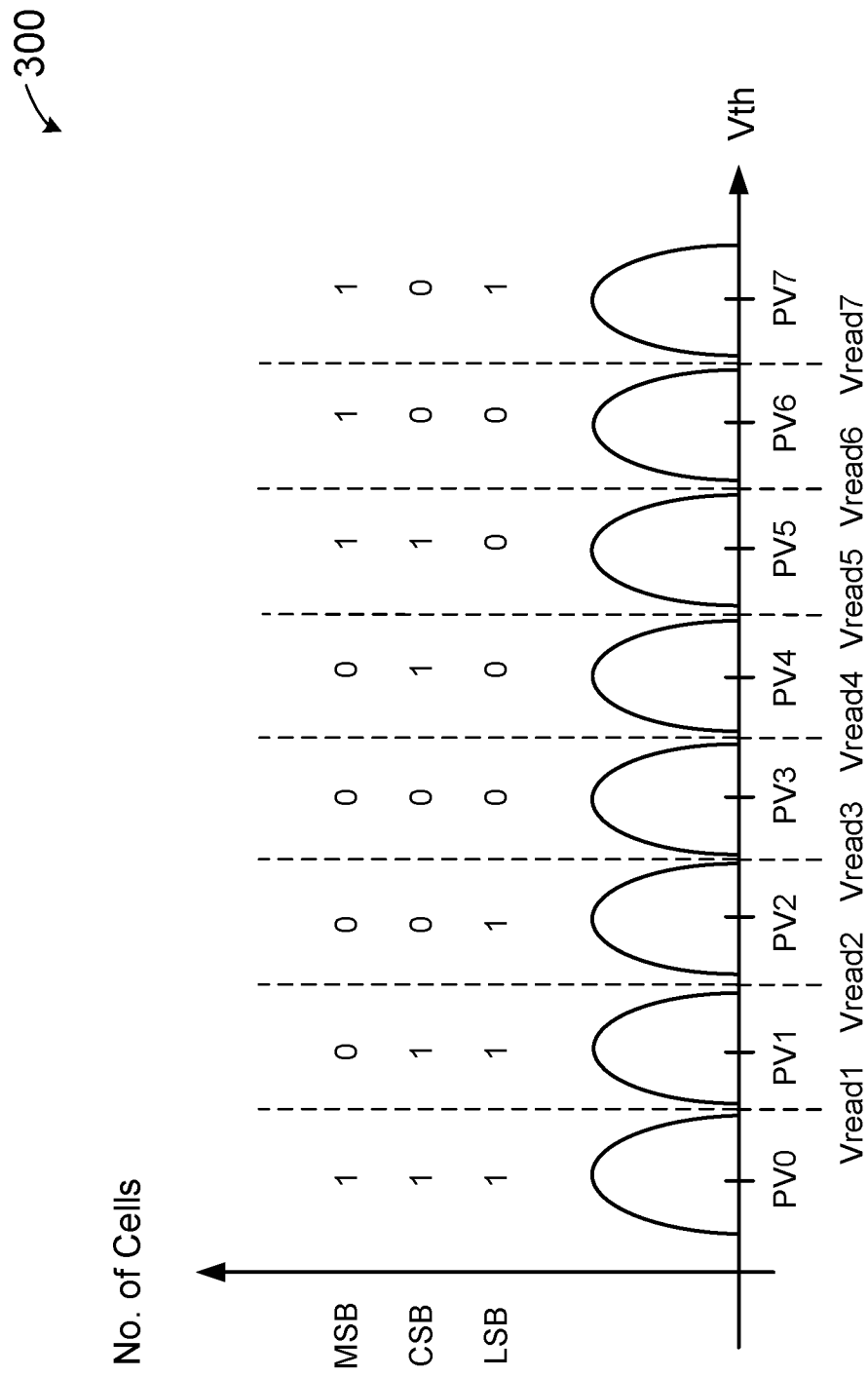
FIG. 3 is a simplified diagram illustrating a distribution of cell voltages of a memory device having a 3-bit tri-level cell (TLC) in a flash memory device according to some embodiments of the present invention.

FIG. 3 is a simplified diagram 300 illustrating a distribution of cell voltages of a memory device having 3-bit tri-level cell (TLC) in a flash memory device according to some embodiments of the present invention. In FIG. 2, the target cell programmed voltage (PV) for an erase state is shown as "PV0," and the programmed voltages (PV) for seven programmed states are shown as "PV1" to "PV7." The distribution of cell voltages, or cell threshold voltages, for each of eight data states is represented as a bell-shaped curve associated with each programmed voltage (PV). The spread in cell threshold voltage can be caused by differences in cell characteristics and operation history. In FIG. 2, each cell is configured to store eight data states represented by three bits: a most significant bit (MSB), a center significant bit (CSB), and a least significant bit (LSB). Also shown in FIG. 3 are seven read thresholds, labeled as "Vread1," "Vread2," ..., and "Vread7," which are used to determine the data stored in the memory cell. Two thresholds, Vread1 and Vread5, are used to read the MSB. If the voltage stored by the cell is less than Vread1 or is greater than Vread5, then the MSB is read as a 1. If the voltage is between Vread1 and Vread5, then the MSB is read as a 0. Two thresholds, Vread3 and Vread7, are used to read the LSB. If the voltage stored by the cell is less than Vread3 or is greater than Vread7, then the LSB is read as a 1. If the voltage is between Vread3 and Vread7, then the LSB is read as a 0. Similarly, three thresholds, Vread2, Vread4, and Vread6, are used to read the CSB.

Figure 4:
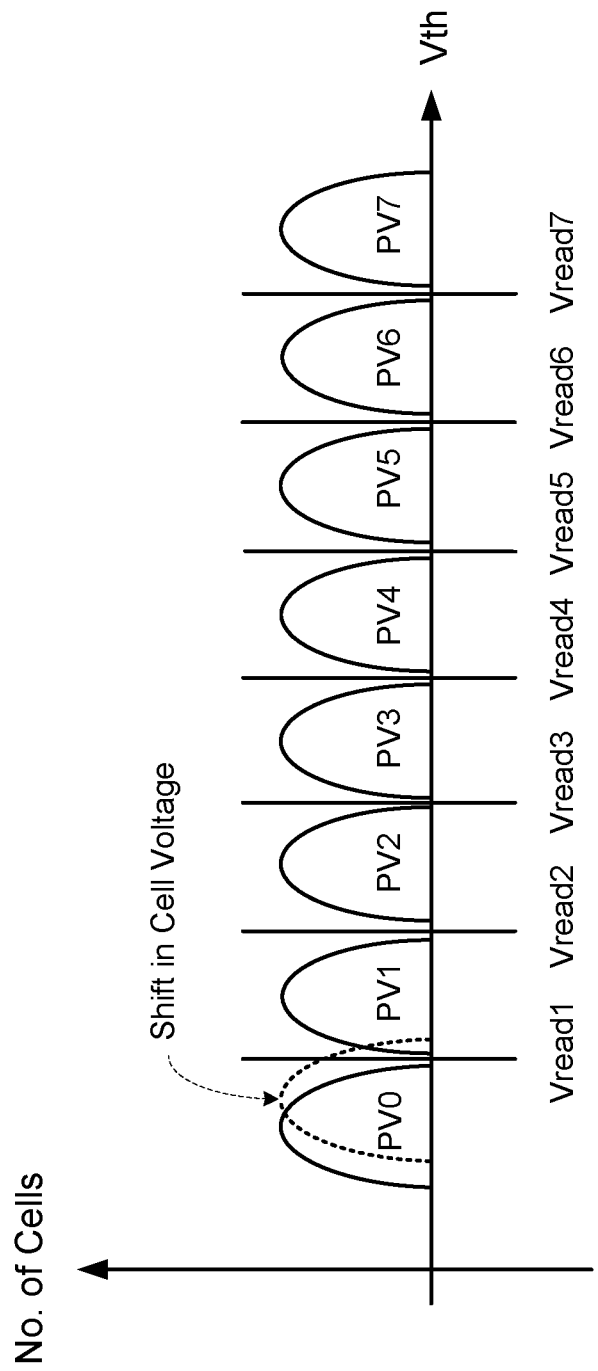
FIG. 4 is a simplified diagram illustrating a shift in the distribution of cell threshold voltages and read thresholds of a memory device according to some embodiments of the present invention.

FIG. 4 is a simplified diagram 400 illustrating a shift in the distribution of cell threshold voltages and read thresholds of a memory device according to some embodiments of the present invention. FIG. 4 illustrates cell threshold voltages for an erase state "PV0" and seven programmed states "PV1" to "PV7" and seven read thresholds, labeled as "Vread1," "Vread2," ..., and "Vread7," of a memory cell, similar to those shown in FIG. 3. After a number of erase-write cycles, cell threshold voltages and the optimum read threshold for the first bit level are shifted to the right.

Another factor that can cause the right-shift of the first threshold is the read disturbance. Read disturbance can make the erase state move to the right. Data retention can also affect the threshold by shifting the distribution. It can be shown that the data in the same block will have similar retention time, or data temperature. For a 3D NAND memory, another factor that can cause cell distribution change is the early retention issue.

Typically, the read-operation may use a sub-optimal threshold-voltage to read the page. Determining the optimal threshold-voltage is an expensive operation in terms of latency and power and it is not desirable to find the optimal threshold-voltage for background-read operations. In this case, it is not necessary that additional read disturb stress will increase the number of errors, as described below.

Figure 5:
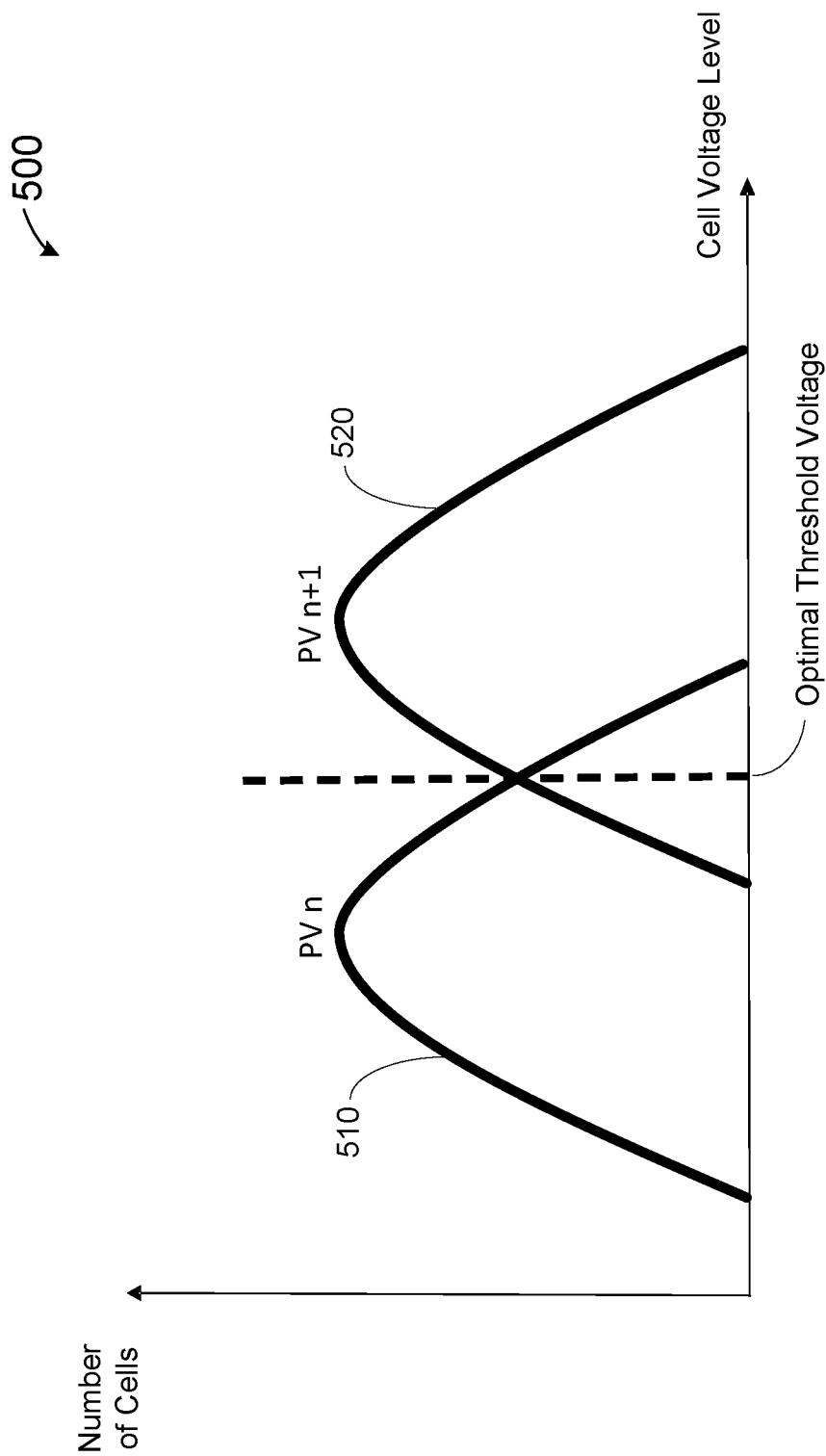
FIG. 5 is a simplified plot of cell voltage distribution in two adjacent programmed voltage (PV) levels in a multi-level memory cell according to some embodiments of the present invention.

FIG. 5 is a simplified plot 500 of cell voltage distribution in two adjacent programmed voltage (PV) levels in a multilevel memory cell according to some embodiments of the present invention. As shown in FIG. 5, curve 510 illustrates a histogram distribution of cell voltages for a program level PVn, and curve 520 illustrates a histogram distribution of cell voltages for a program level PVn+1. PV n and PVn+1 represent two data states. There is overlap in the cell voltage distributions for these two PV levels. In a cell read operation, a read threshold is used to distinguish the two PV levels. An optimal read threshold-voltage can be set at the cell-level where the number of cells for both PV levels are equal. The sub-optimal read-threshold actually used for the read-operations may be lower or higher than the optimal threshold voltage. As described above, in a read disturb test read, a sub-optimal read threshold is often used.

Figure 6A:
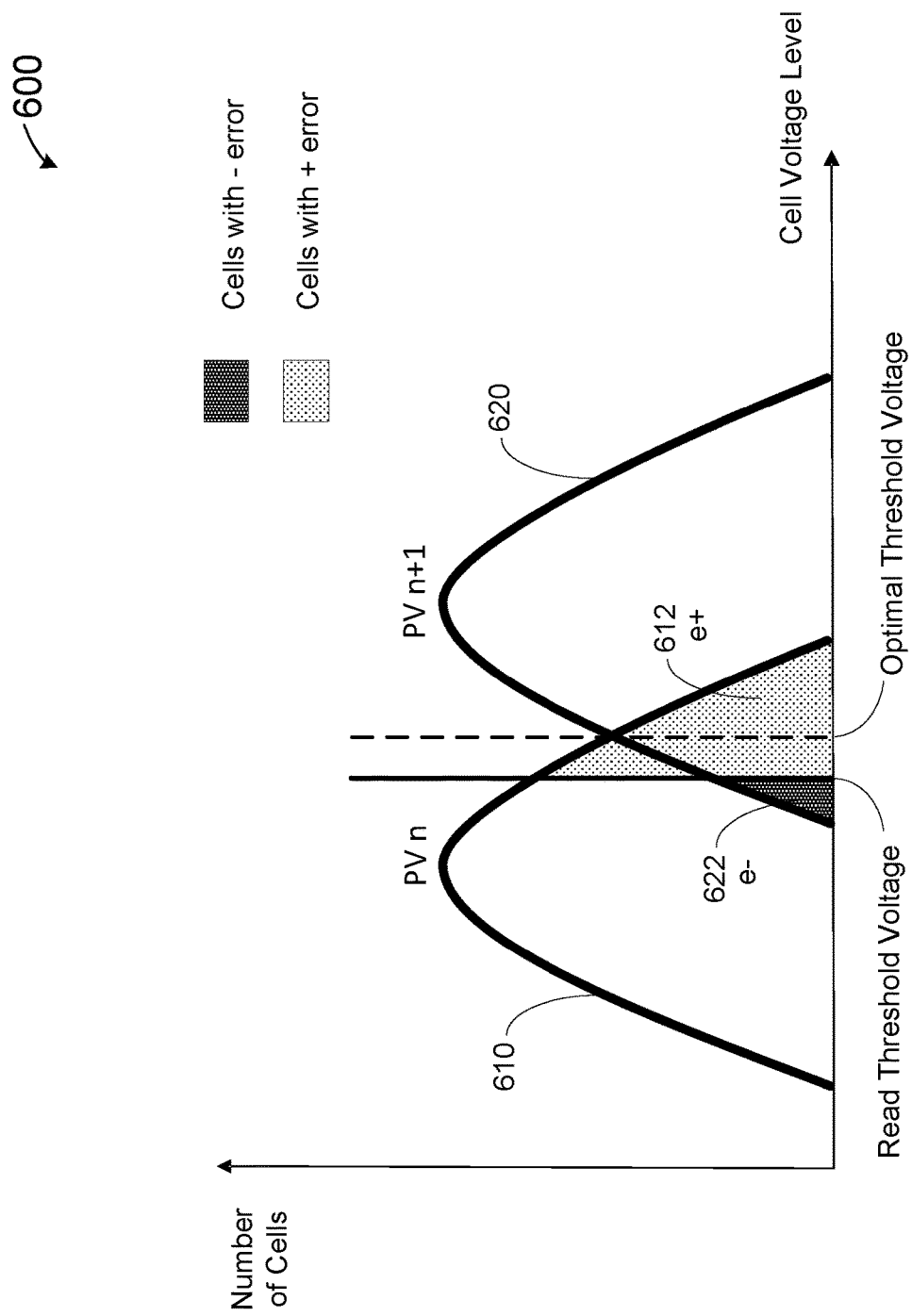
FIG. 6A is a simplified plot of cell voltage distribution in two adjacent programmed voltage (PV) levels in a multi-level memory cell according to some embodiments of the present invention.

FIG. 6A is a simplified plot 600 of cell voltage distribution in two adjacent programmed voltage (PV) levels in a multilevel memory cell with a sub-optimal read threshold according to some embodiments of the present invention. As shown in FIG. 6A, curve 610 illustrates a histogram distribution of cell voltages for a program level PVn, and curve 620 illustrates a histogram distribution of cell voltages for a program level PVn+1. In FIG. 6A, a region 612 represents the cells belonging in the PVn level that are read as being in the PVn+1 level resulting in error cells. Further, a region 622 represents the cells belonging in the PVn+1 level that are read as being in the PVn level, also resulting in error cells. Let the number of cells in the PVn level that are read as being in PVn+1 level be denoted by e+, i.e. the number of cell-errors in the direction of increasing cell-level. In an error correction decoding, the e+ cells would be corrected to the correct PVn level. Therefore, for these e+ cells, the PV lever, PVn+1, is referred to as the "read programmed voltage," and the PV lever, PVn, is referred to as the "corrected programmed voltage." Further, e+ can be referred to as a first error count that represents a total number of error cells that have a higher read programmed voltage (PV-r) than corrected programmed voltage (PV-c).

Similarly, the number of cells belonging in the PVn+1 level that are read as being in the PVn level can be denoted by e-, i.e. the number of cell-errors in the direction of decreasing cell-level. In an error correction decoding, the e- cells would be corrected to the correct PVn+1 level. Therefore, for these e- cells, the PV level, PVn, is referred to as the "read programmed voltage," and the PV leverl, PVn+1, is referred to as the "corrected programmed voltage." Further, e- can be referred to as a second error count that represents a total number of error cells that have a lower read programmed voltage (PV-r) than corrected programmed voltage (PV-c).

In FIG. 6A, the actual read threshold voltage is lower than the optimal read threshold, and region 612 is greater than region 622. In other words, e+>e-, or equivalently, the first error count is greater than the second error count.

In the scenario depicted in FIG. 6A, in an error correction decoding, the e+ cells would be corrected to the correct PVn level. Therefore, for these e+ cells, the PV lever, PVn+1, is referred to as the "read programmed voltage," and the PV lever, PVn, is referred to as the "corrected programmed voltage." Further, e+ can be referred to as a first error count that represents a total number of error cells that have a higher read programmed voltage (PV-r) than corrected programmed voltage (PV-c). Further, e- can be referred to as a second error count that represents a total number of error cells that have a lower read programmed voltage (PV-r) than corrected programmed voltage (PV-c).

Figure 6B:
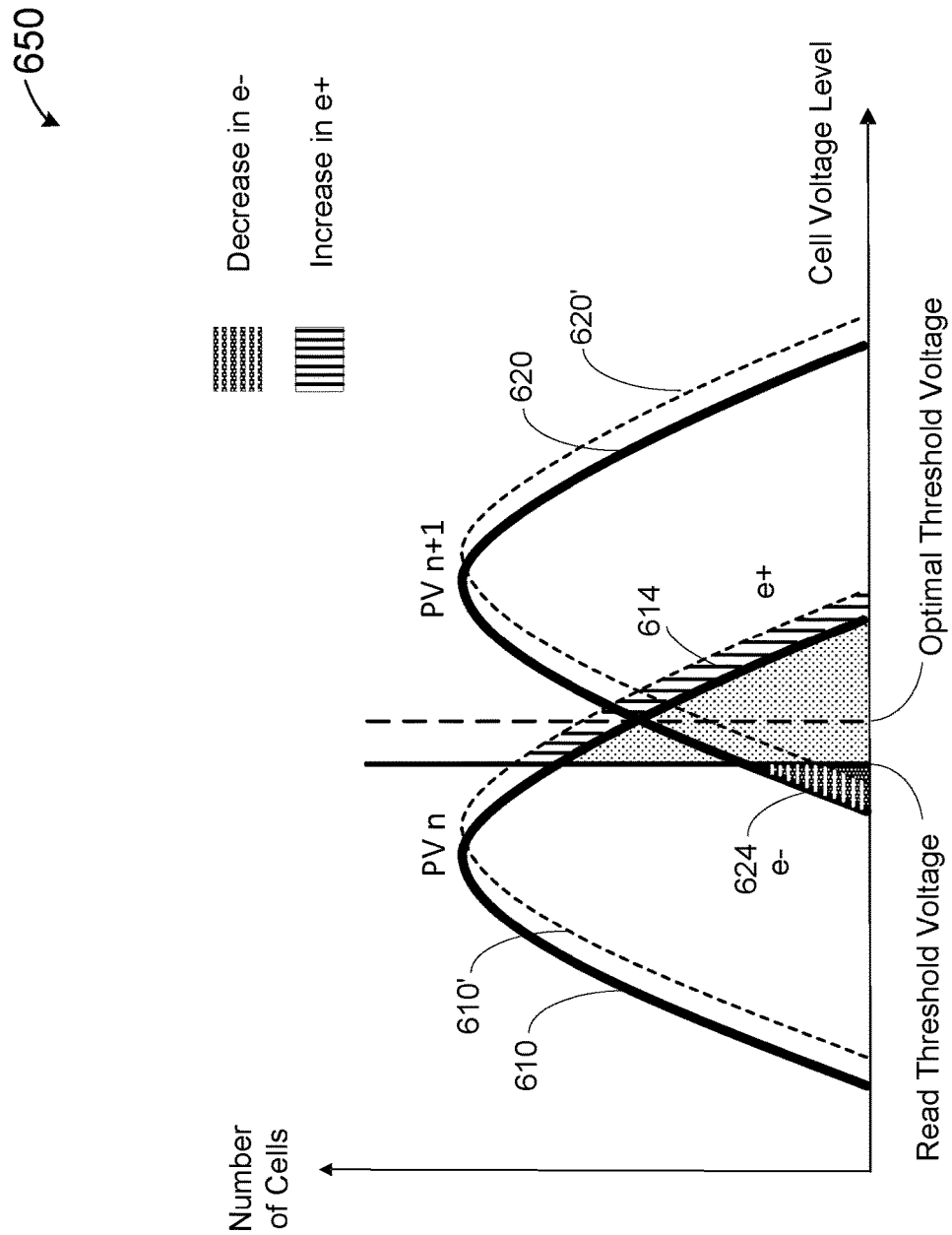
FIG. 6B is a simplified plot of cell voltage distribution in two adjacent programmed voltage (PV) levels in a multi-level memory cell with cell levels shifting caused by read disturb according to some embodiments of the present invention.

FIG. 6B is a simplified plot 650 of cell voltage distribution in two adjacent programmed voltage (PV) levels in a multilevel memory cell with cell levels shifting caused by read disturb according to some embodiments of the present invention. As described above, additional read disturb stress to the block can cause the cell-levels to increase, as illustrated in FIG. 4. For example, increasing the cell levels would cause distribution curves 610 and 620 in FIG. 6A to shift to the right, as shown in FIG. 6B. In FIG. 6B, curve 610' illustrates a histogram distribution of cell voltages for a program level PVn after being shifted by read disturb, and curve 620' illustrates a histogram distribution of cell voltages for a program level PVn+1 after being shifted by read disturb. As a result of the shift, the first error count e+ and the second error count e- are changed. In FIG. 6B, region 614 shows the increase in the first error count e+, and region 624 shows the decrease in the second error count e−. It can be seen that, in FIG. 6B, region 614 is larger than region 624. Therefore, the total number of error cells is reduced by the shifting of cell voltage distributions caused by additional read disturb error.

Figure 7A:
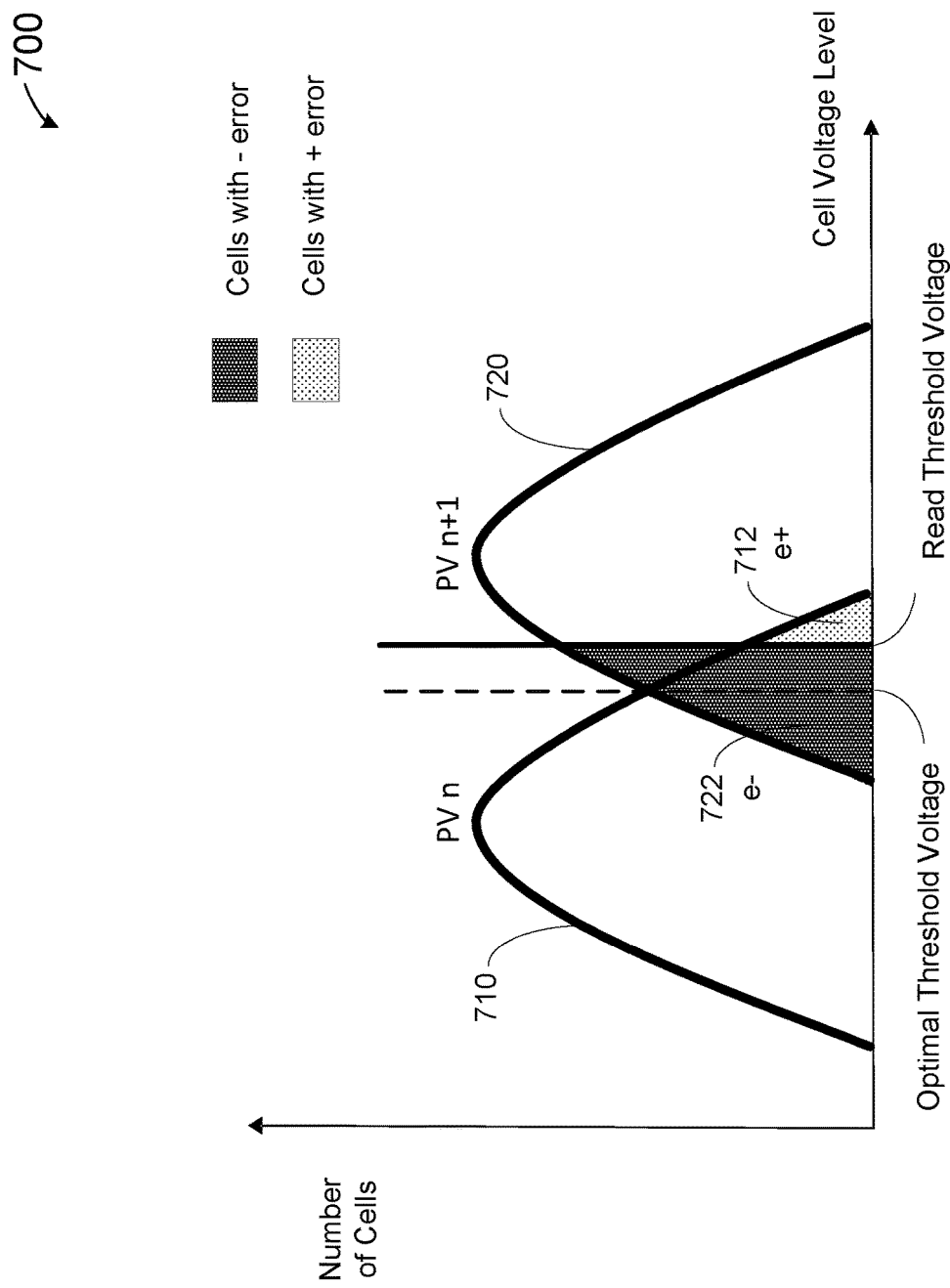
FIG. 7A is another simplified plot of cell voltage distribution in two adjacent programmed voltage (PV) levels in a multilevel memory cell according to some embodiments of the present invention.

FIG. 7A is another simplified plot 700 of cell voltage distribution in two adjacent programmed voltage (PV) levels in a multilevel memory cell with a sub-optimal read threshold according to some embodiments of the present invention. As shown in FIG. 7A, curve 710 illustrates a histogram distribution of cell voltages for a program level PVn, and curve 720 illustrates a histogram distribution of cell voltages for a program level PVn+1. In FIG. 7A, a region 712 represents the cells belonging in the PVn level that are read as being in the PVn+1 level resulting in error cells. Further, a region 722 represents the cells belonging in the PVn+1 level that are read as being in the PVn level, also resulting in error cells. Let the number of cells in the PVn level that are read as being in PVn+1 level be denoted by e+, i.e. the number of cell-errors in the direction of increasing cell-level. Similarly, the number of cells in PVn+1 level that are read as being in PVn level can be denoted by e−, i.e. the number of cell-errors in the direction of decreasing cell-level.

In FIG. 7A, the actual read threshold voltage is higher than the optimal read threshold, resulting in region 712 being less than region 622. In other words, e+<e−, or equivalently, the first error count is less than the second error count according to the definition of first error count and second error count described above in connection with FIG. 6A.

Figure 7B:
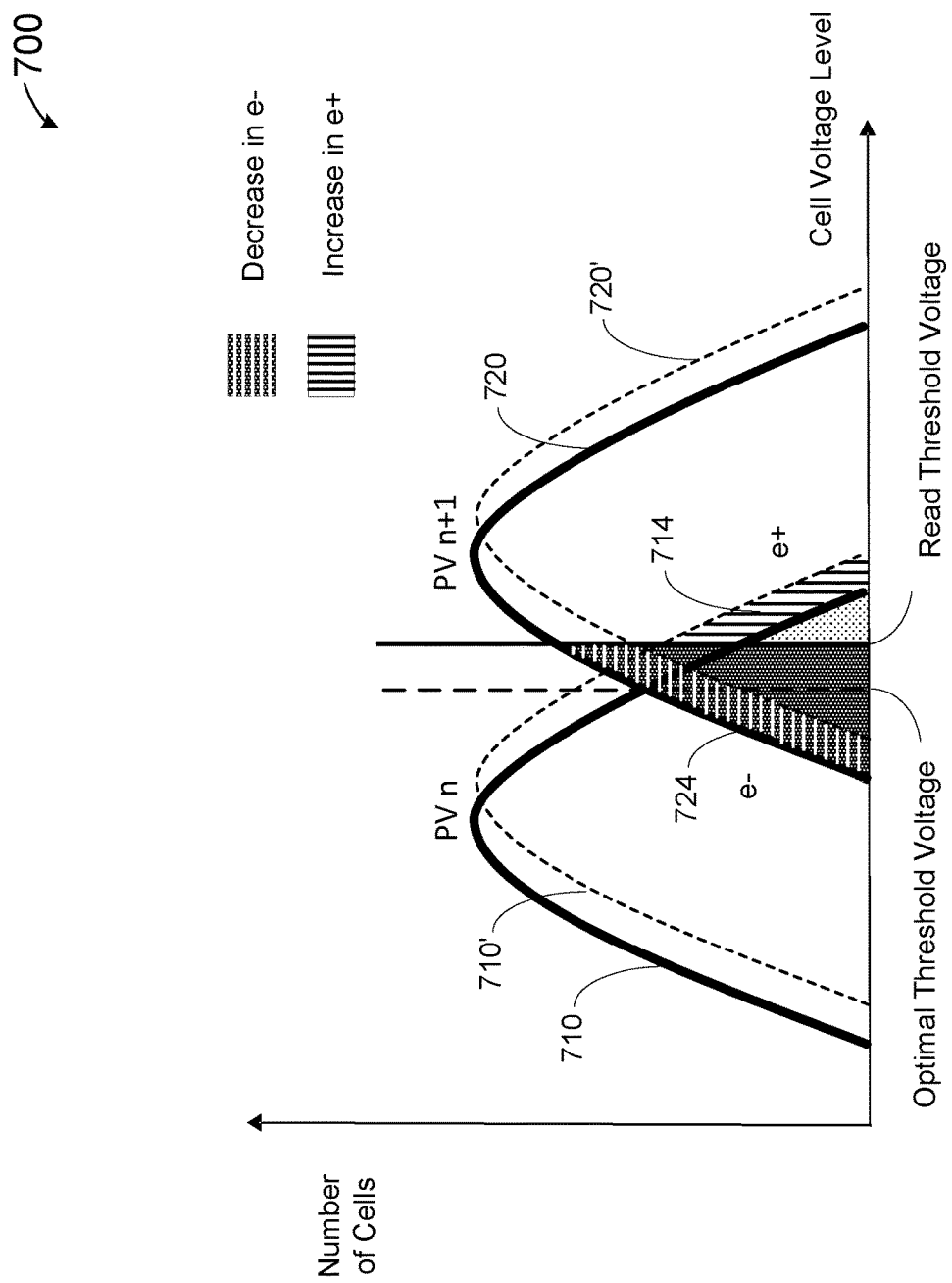
FIG. 7B is a simplified plot of cell voltage distribution in two adjacent programmed voltage (PV) levels in a multi-level memory cell with cell levels shifting caused by read disturb according to some embodiments of the present invention.

FIG. 7B is a simplified plot 750 of cell voltage distribution in two adjacent programmed voltage (PV) levels in a multilevel memory cell with cell levels shifting caused by read disturb according to some embodiments of the present invention. As described above, additional read disturb stress to the block can cause the cell-levels to increase, as illustrated in FIG. 4. For example, increasing the cell levels would cause distribution curves 710 and 720 in FIG. 7A to shift to the right, as shown in FIG. 7B. In FIG. 7B, curve 710' illustrates a histogram distribution of cell voltages for a program level PVn after being shifted by read disturb, and curve 720' illustrates a histogram distribution of cell voltages for a program level PVn+1 after being shifted by read disturb. As a result of the shift, the first error count e+ and the second error count e− are changed. In FIG. 7B, region 714 shows the increase in the first error count e+, and region 724 shows the decrease in the second error count e−. It can be seen that, in FIG. 7B, region 724 is larger than region 714. Therefore, the total number of error cells is reduced by the shifting of cell voltage distributions caused by additional read disturb error.

In a conventional memory system, whether or not to carry out read reclaim operations is often determined based on the number of errors in the page-read, or the number of errors in the page-read divided by the error-correction capability of the ECC decoder. Embodiments of the present invention provide a read reclaim method, in which $e^+$ and $e^-$ are used to determine if the block can handle additional read disturb or not. A read-reclaim operation should be performed only in the latter case. For instance, in the example of FIG. 6A, e+ is greater than e−, and FIG. 6B shows that additional read disturb will increase the number of total error counts. Therefore, a read reclaim operation should be carried out for the scenario depicted in FIG. 6A. On the other hand, in the example of FIG. 7A, e+ is less than e−, and FIG. 7B shows that additional read disturb will decrease the number of total error counts. Therefore, a read reclaim operation need not be carried out for the scenario depicted in FIG. 7A.

It is noted that FIGS. 6A, 6B, 7A, and 7B depict scenarios in which sub-optimal read threshold voltages are used to read the memory cells that result in asymmetric error cell distributions, for example, e+>e−, or e−>e+. Such asymmetric error cell distributions can also occur even with optimal read threshold voltages. In such cases, the read reclaim methods described herein are more effective than conventional methods.

Figure 8:
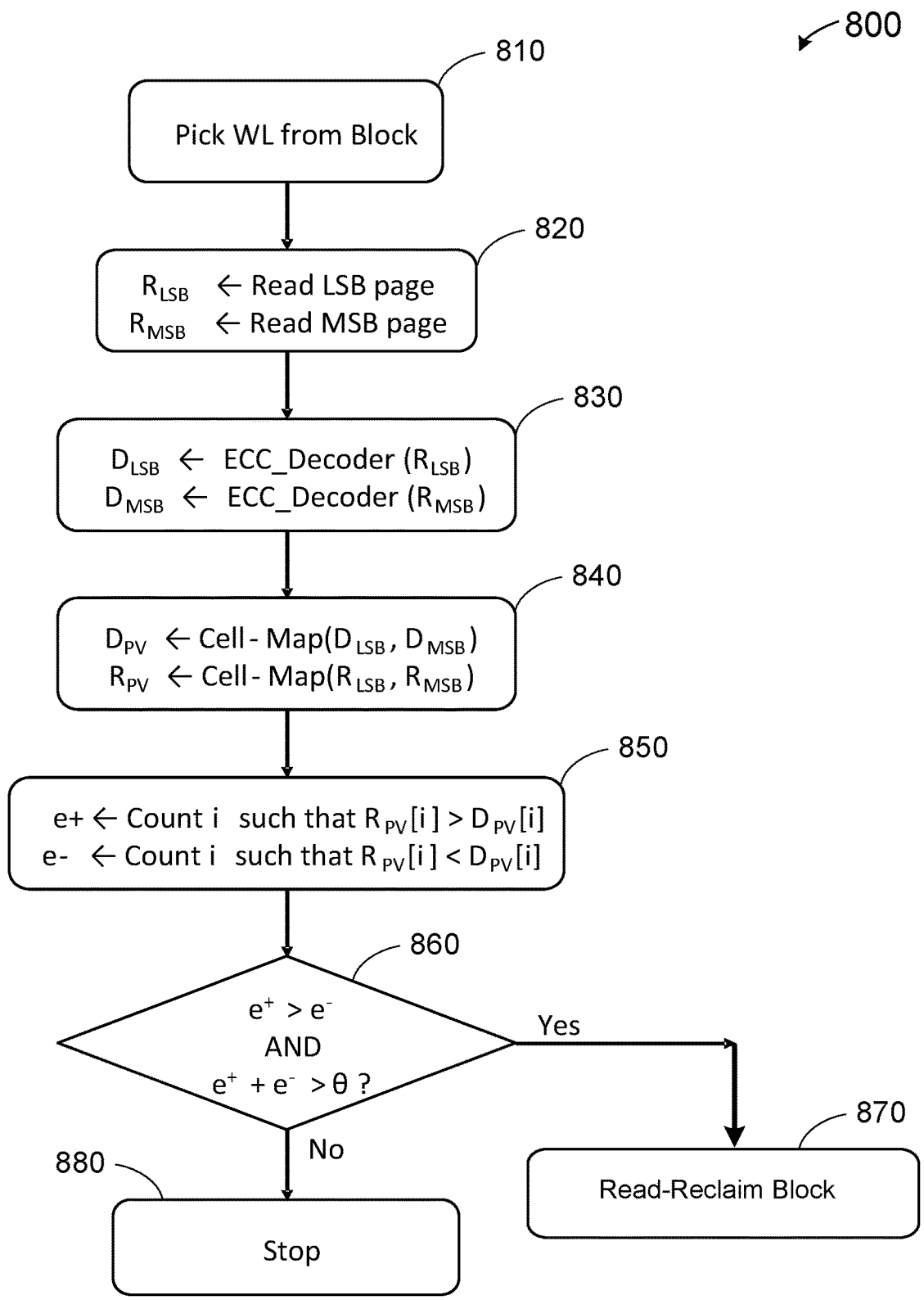
FIG. 8 is a flowchart illustrating a method for performing a read reclaim operation according to some embodiments of the present invention.

FIG. 8 is a flowchart illustrating a method 800 for performing a read reclaim operation according to some embodiments of the present invention. In method 800, when a block of memory cells is selected, a word-line (WL) from the block is chosen (Step 810). In some embodiments, one word-line, or a small set of word-lines, e.g., no more than ten word-lines, that typically gives most errors is chosen. The selection of word lines can be done offline.

Next, at Step 820, all logical pages belonging to that word-line are read. In FIG. 8, $R_{LSB}$ represents the LSB page that has been read, and $R_{MSB}$ represents the MSB page that has been read. For example, if a 2-bit per cell MLC NAND memory is used, both MSB and LSB pages are read. When the memory device, e.g., a solid state drive (SSD), is online, the pages in these chosen word-line(s) are analyzed.

At Step 830, the ECC decoder is run on all logical pages. In FIG. 8, $D_{LSB}$ represents the ECC decoded LSB page, and $D_{MSB}$ represents the ECC decoded MSB page. It is understood that $R_{LSB}$ and $R_{MSB}$ may contain errors and that $D_{LSB}$ and $D_{MSB}$ have the correct data for the pages.

At Step 840, programmed voltage (PV) levels for all cells are reconstructed using the mapping between the PV level of a cell and the corresponding bit in the LSB and MSB pages. For each cell, the PV level from the read-operation is compared with the PV level from the decoder outputs. In FIG. 8, $R_{PV}$ represents the PV level of a memory cell whose data state determined by the read operation is represented by the read data $R_{LSB}$ and $R_{MSB}$. $D_{PV}$ represents the PV level of the memory cell whose decoded or corrected data state is represented by the read data $D_{LSB}$ and $D_{MSB}$.

At Step 850, the errors are identified based on the results of comparison in Step 840. Further, $e^+$ and $e^-$ are computed. As described above in connection with FIGS. 6A-7b, e+ represents the number of cells in the PVn level that are read as being in PVn+1 level, i.e., the number of cell-errors in the direction of increasing cell-level. Similarly, e− represents the number of cells in PVn+1 level that are read as being in PVn level, i.e., the number of cell-errors in the direction of decreasing cell-level.

At Step 860, a decision is made on whether to perform a read reclaim operation. If the value of $e^+$ is larger than the value of $e^-$, and the total number of cell-errors, which is equal to $e^+ + e^-$, exceeds a pre-determined threshold θ, the read-reclaim operation is performed for the block (Step 870). Otherwise, the read-reclaim operation is skipped (Step 880), since it is expected that additional read disturb will not cause the number of errors to increase. In some embodiments, if $e^+ = e^-$, the read reclaim operation is also performed. In this case, the condition for performing the read reclaim operation is $e^+ \geq e^-$, and $e^+ + e^- > \theta$.

Figure 9:
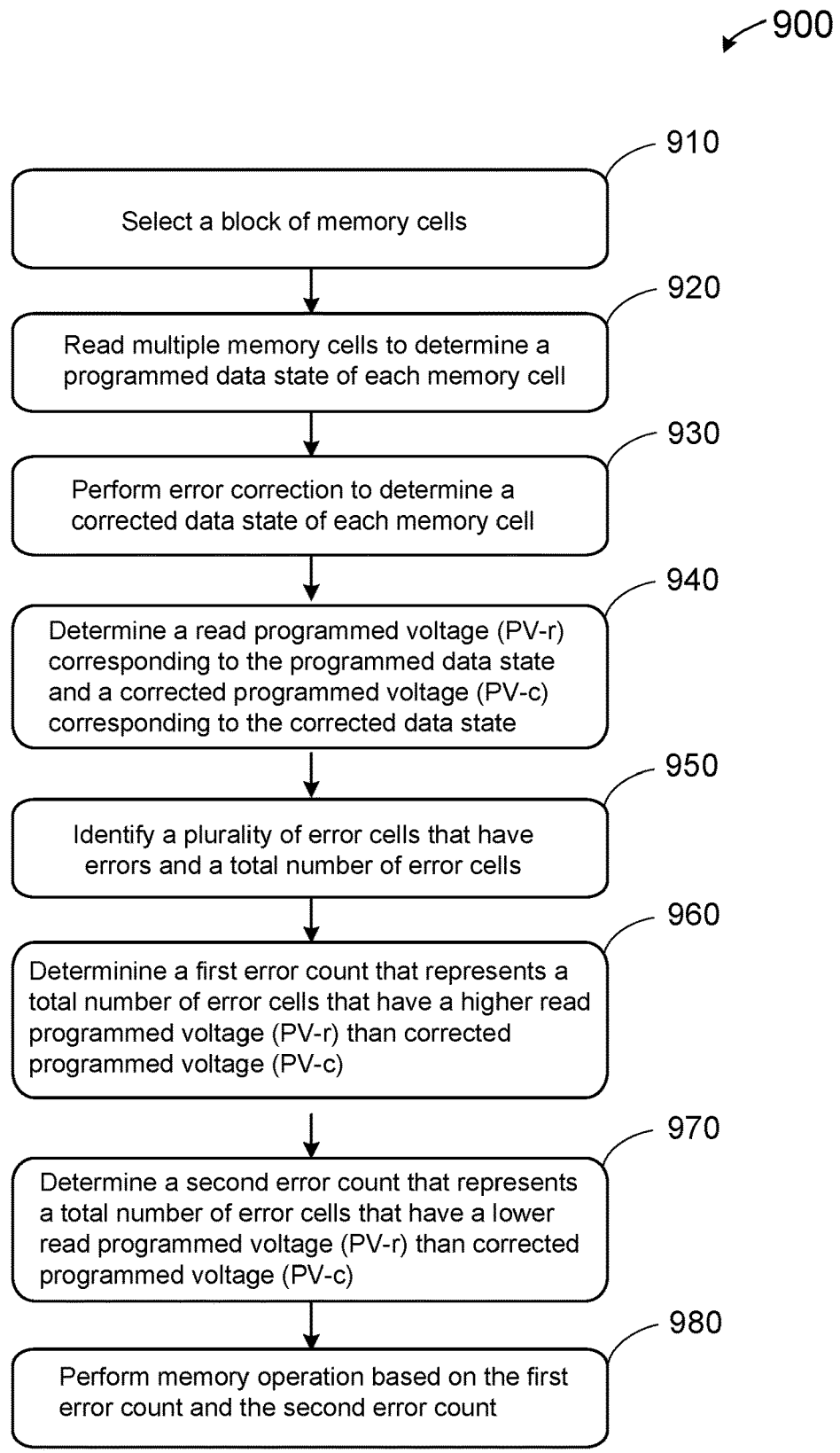
FIG. 9 is a flowchart illustrating another method for controlling a storage system according to some embodiments of the present invention.

FIG. 9 is a flowchart illustrating another method 900 for controlling a storage system according to some embodiments of the present invention. The storage system includes a plurality of memory cells arranged in blocks and a memory controller coupled to the plurality of memory cells for controlling data write and read in the plurality of memory cells. An example of the storage system is described above in connection to FIGS. 1-8 and further described in FIGS. 10 and 11. The method 900 for controlling the storage system includes selecting a block of memory cells (Step 910). Each memory cell is programmed to a data state corresponding to one of multiple cell programmed voltages (PVs) from PV0 to PVN, where PV0<PV1< . . . <PVN, N being an integer.

The method includes reading multiple memory cells in the block to determine a programmed data state of each memory cell (Step 920), and performing error correction decoding of the multiple memory cells to determine a corrected data state of each memory cell (Step 930). At Step 940, the method includes, for each memory cell, determining a read programmed voltage (PV-r) corresponding to the programmed data state determined by reading the memory cell, and determining a corrected programmed voltage (PV-c) corresponding to the data state determined by the error correction decoding.

At Step 950, the method also includes identifying a plurality of error cells that have errors and a total number of error cells. Further, a first error count and a second error count is determined. At Step 960, a first error count is determined. The first error count represents a total number of error cells that have a higher read programmed voltage (PV-r) than corrected programmed voltage (PV-c). At Step 970, a second error count is determined. The second error represents a total number of error cells that have a lower read programmed voltage (PV-r) than corrected programmed voltage (PV-c). At Step 980, the method further includes performing a memory operation based on the first error count and the second error count.

In an embodiment of the above method, the memory cells are configured such that the first error count is increased by read disturb and the second error count is decreased by read disturb.

In another embodiment, the method further includes determining if the first error count is higher than the second error count and determining if the total number of error cells is higher than a threshold error count. Upon determining that the first error count is higher than the second error count and the total number of error cells is higher than a threshold error count, a read reclaim operation of the selected block is performed.

In another embodiment, the read reclaim operation comprises copying valid values from the plurality of the memory cells to another plurality of memory cells.

In another embodiment, each memory cell is configured to store two binary bits of data and has four data states, 11, 01, 00, and 10 corresponding to four cell programmed voltages PV0-PV3, where PV0<PV1<PV2<PV3.

In another embodiment, each memory cell is configured to store three binary bits of data and has eight data states, 111, 011, 001, 000, 010, 110, 100, and 101 corresponding to four cell programmed voltages PV0-PV7, where PV0<PV1<PV2<PV3<PV4<PV5<PV6<PV7.

Figure 10:
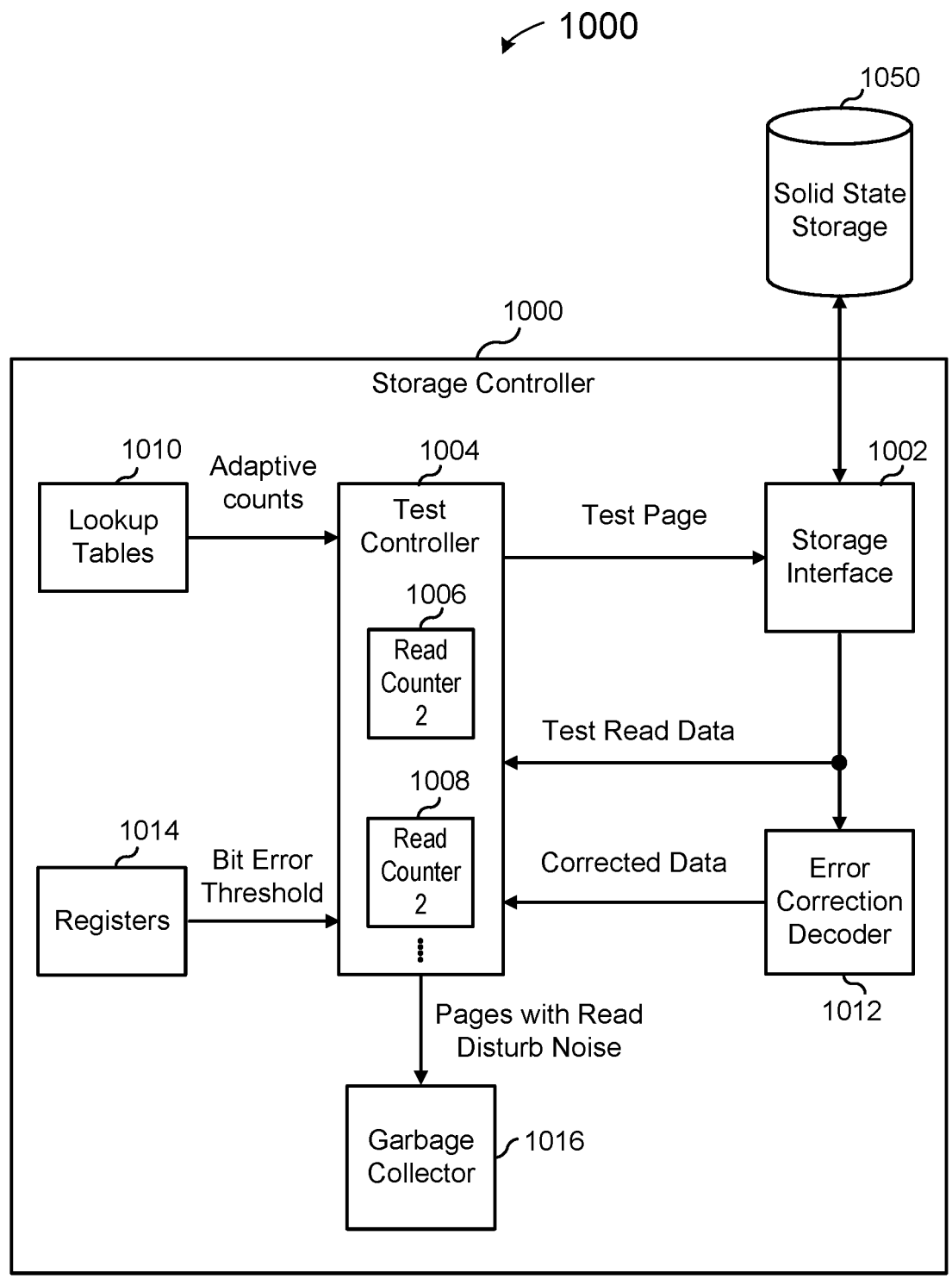
FIG. 10 is a simplified block diagram illustrating a solid state storage system according to some embodiments of the present invention.

FIG. 10 is a simplified block diagram illustrating a solid state storage system according to some embodiments of the present invention. Storage controller 1000, also referred to as memory controller, is one example of a system which performs the techniques described herein. In some embodiments, storage controller 1000 can be implemented on a semiconductor device, such as an ASIC or FPGA.

Test controller 1004 includes a plurality of read counters, including read counters 1006 and 1008. Each read counter in this example is associated with a different group of blocks for which reads to those groups of blocks is being tracked. For example, the first read counter 1006 counts reads to a first group of blocks on solid state storage 1050, and the second read counter 1008 counts reads to a second group of blocks on solid state storage 1050. For simplicity, solid state storage 1050 is shown in this figure as a single device or component, but in some embodiments it may include multiple devices or multiple components.

Storage controller 1000 can include lookup tables 1010, which can provide adaptive read threshold counts and adaptive error threshold counts. A target read threshold and an error threshold, as described above, can be selected from lookup tables 1010 based on the number of bit errors.

The test read data for the initial test page and/or the adjacent page are passed from storage interface 1002 to error correction decoder 1012 and test controller 1004. Error correction decoder 1012 (e.g., an LDPC decoder or a BCH decoder) performs error correction decoding on the test read data and sends the corrected data (assuming the test read data is able to be corrected, in other words, within the error correcting capability of the system) to test controller 1004. Test controller 1004 uses the (uncorrected) test read data from storage interface 1002 and the corrected data from error correction decoder 1012 to determine a number of bit errors. If the number of bit errors reaches a multiple of a bit error threshold, also referred to as a read threshold, which can be obtained, for example, from registers 1014 (which are programmable), then the test controller flags the tested page (e.g., the initial test page or the adjacent page) as a candidate for a read reclaim operation.

Test controller 1004 identifies the pages with read disturb noise to garbage collector 1016, which performs corrective processing on those pages (e.g., by copying the data, with or without error correction decoding, to a new location). If some other corrective processes are performed (e.g., in addition to or as an alternative to garbage collection), then test controller 1004 would identify the pages with read disturb noise to those components.

Figure 11:
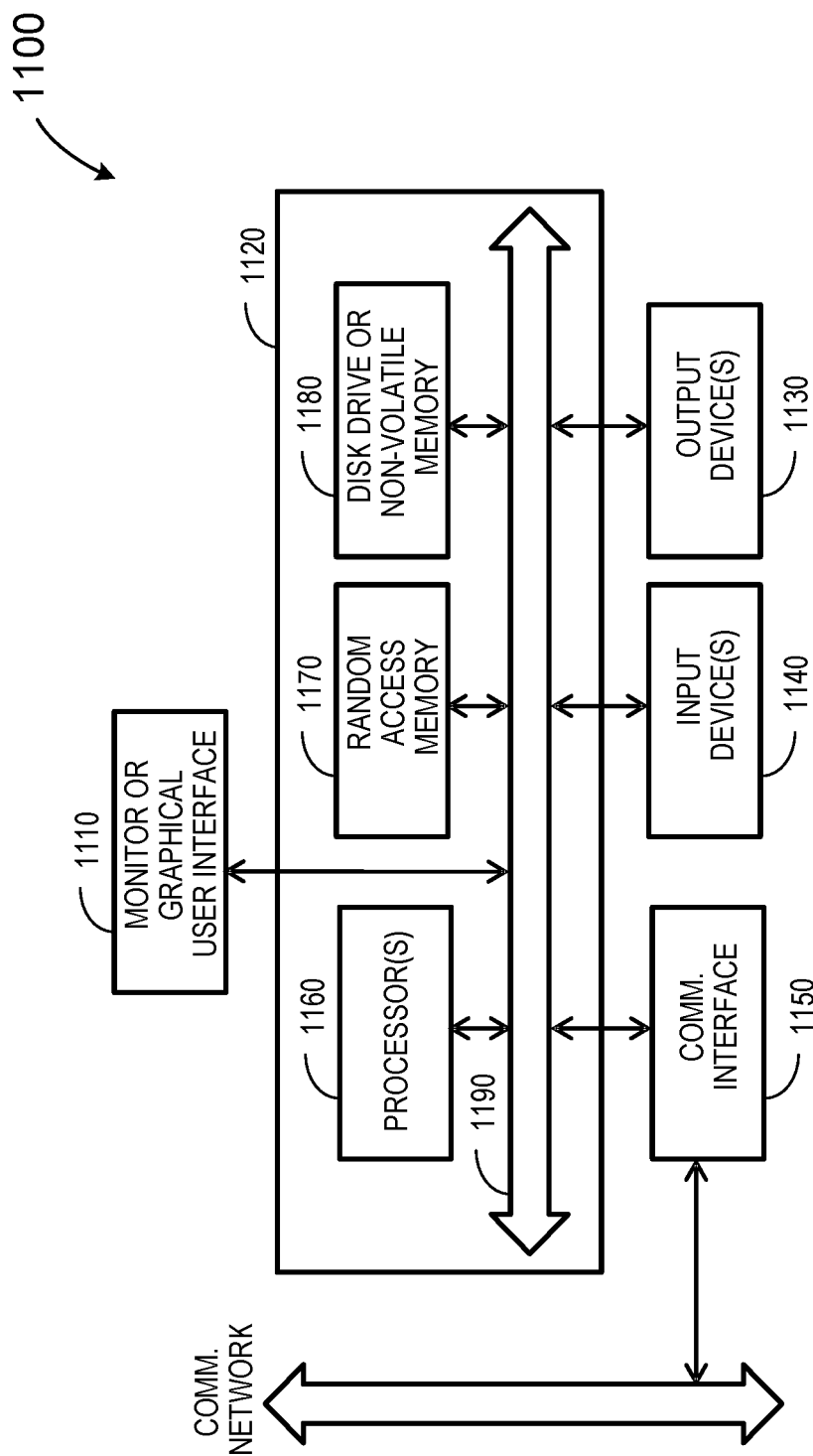
FIG. 11 is a simplified block diagram illustrating an apparatus that may be used to implement various embodiments according the present invention.

FIG. 11 is a simplified block diagram illustrating an apparatus that may be used to implement various embodiments according the present invention. FIG. 11 is merely illustrative of an embodiment incorporating the present disclosure and does not limit the scope of the disclosure as recited in the claims. One of ordinary skill in the art would recognize other variations, modifications, and alternatives. In one embodiment, computer system 1100 typically includes a monitor 1110, a computer 1120, user output devices 1130, user input devices 1140, communications interface 1150, and the like.

As shown in FIG. 11, computer 1120 may include a processor(s) 1160 that communicates with a number of peripheral devices via a bus subsystem 1190. These peripheral devices may include user output devices 1130, user input devices 1140, communications interface 1150, and a storage subsystem, such as random access memory (RAM) 1170 and disk drive 1180.

User input devices 1140 can include all possible types of devices and mechanisms for inputting information to computer system 1120. These may include a keyboard, a keypad, a touch screen incorporated into the display, audio input devices such as voice recognition systems, microphones, and other types of input devices. In various embodiments, user input devices 1140 are typically embodied as a computer mouse, a trackball, a track pad, a joystick, wireless remote, drawing tablet, voice command system, eye tracking system, and the like. User input devices 1140 typically allow a user to select objects, icons, text and the like that appear on the monitor 1110 via a command such as a click of a button or the like.

User output devices 1130 include all possible types of devices and mechanisms for outputting information from computer 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 typically include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computer 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, computer 1120 includes one or more Xeon microprocessors from Intel as processor(s) 1160. Further, in one embodiment, computer 1120 includes a UNIX-based operating system.

RAM 1170 and disk drive 1180 are examples of tangible storage media configured to store data such as embodiments of the present disclosure, including executable computer code, human readable code, or the like. Other types of tangible storage media include floppy disks, removable hard disks, optical storage media such as CD-ROMS, DVDs and bar codes, semiconductor memories such as flash memories, read-only memories (ROMS), battery-backed volatile memories, networked storage devices, and the like. RAM 1170 and disk drive 1180 may be configured to store the basic programming and data constructs that provide the functionality of the present disclosure.

Software code modules and instructions that provide the functionality of the present disclosure may be stored in RAM 1170 and disk drive 1180. These software modules may be executed by processor(s) 1160. RAM 1170 and disk drive 1180 may also provide a repository for storing data used in accordance with the present disclosure.

RAM 1170 and disk drive 1180 may include a number of memories including a main random access memory (RAM) for storage of instructions and data during program execution and a read-only memory (ROM) in which fixed non-transitory instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 provides a mechanism for letting the various components and subsystems of computer 1120 communicate with each other as intended. Although bus subsystem 1190 is shown schematically as a single bus, alternative embodiments of the bus subsystem may utilize multiple busses.

FIG. 11 is representative of a computer system capable of embodying the present disclosure. It will be readily apparent to one of ordinary skill in the art that many other hardware and software configurations are suitable for use with the present disclosure. For example, the computer may be a desktop, portable, rack-mounted or tablet configuration.

Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A non-volatile data storage device, comprising:
    memory cells arranged in blocks; and
    a memory controller coupled to the memory cells for controlling program and read operations of the memory cells;
    wherein each memory cell is programmed to a data state corresponding to one of multiple cell programmed voltages (PVs) from PV0 to PVN, where PV0< PV1< . . . <PVN, N being an integer;

wherein the memory controller is configured to perform a read reclaim operation as follows:
select a block of memory cells;
read multiple memory cells in the block to determine a programmed data state of each memory cell;
perform error correction decoding of the multiple memory cells to determine a corrected data state of each memory cell;
for each memory cell, determine a read programmed voltage (PV-r) corresponding to the programmed data state determined by the read operation, and determine a corrected programmed voltage (PV-c) corresponding to the data state determined by the error correction decoding;
identify a plurality of error cells that have errors and determine a total number of error cells;
determine a first error count e+ that represents a total number of error cells that have a higher read programmed voltage (PV-r) than corrected programmed voltage (PV-c); and
determine a second error count e− that represents a total number of error cells that have a lower read programmed voltage (PV-r) than corrected programmed voltage (PV-c);
determine if the first error count is higher than the second error count;
determine if the total number of error cells is higher than a threshold error count; and
upon determining that the first error count is higher than the second error count and the total number of error cells is higher than a threshold error count, perform a read reclaim operation to the block of memory cells.

2. The device of claim 1, wherein the read reclaim operation comprises copying valid values from the plurality of the memory cells to another plurality of memory cells.

3. The device of claim 1, wherein each memory cell is configured to store two binary bits of data and has four data states, 11, 01, 00, and 10 corresponding to four cell programmed voltages PV0-PV3, where PV0<PV1<PV2<PV3.

4. The device of claim 1, wherein each memory cell is configured to store three binary bits of data and has eight data states, 111, 011, 001, 000, 010, 110, 100, and 101 corresponding to four cell programmed voltages PV0-PV7, where PV0<PV1<PV2<PV3<PV4<PV5<PV6<PV7.

5. The device of claim 1, wherein the memory controller is configured to read multiple memory cells that are coupled to a word line in the block to determine a data state of each of the multiple memory cells.

6. The device of claim 1, where the memory controller is configured to identify a plurality of error cells by comparing, for each memory cell, the read programmed voltage (PV-r) with the corrected programmed voltage (PV-c).

7. A system, comprising:
memory cells arranged in blocks; and
a memory controller coupled to the memory cells for controlling program and read operations of the memory cells;
wherein the memory controller is configured to:
select a block of memory cells;
identify a plurality of error cells that have errors and determine a total number of error cells;
determine a first error count e+ that represents a number of cell-errors in the direction of increasing cell-level and a second error count e− that represents a number of cell-errors in the direction of decreasing cell-levels, wherein the total number of error cells comprises the first error count e+ and the second error count e−; and
perform a memory operation based on the first error count and the second error count;
wherein the memory controller is further configured to:
determine if the first error count e+ is higher than the second error count e−;
determine if the total number of error cells is higher than a threshold error count; and
upon determining that the first error count is higher than the second error count and the total number of error cells is higher than the threshold error count, perform a read reclaim operation of the selected block of memory cells.

8. The system of claim 7,
wherein each memory cell is programmed to a data state corresponding to one of multiple cell programmed voltages (PVs) from PV0 to PVN, where PV0< PV1< . . . <PVN, N being an integer;
wherein the memory controller is configured to:
select a block of memory cells;
read multiple memory cells in the block to determine a programmed data state of each memory cell;
perform error correction decoding of the multiple memory cells to determine a corrected data state of each memory cell;
for each memory cell, determine a read programmed voltage (PV-r) corresponding to the programmed data state determined by the read operation, and determine a corrected programmed voltage (PV-c) corresponding to the data state determined by the error correction decoding;
identify a plurality of error cells that have errors and determine a total number of error cells;
determine the first error count e+ that represents a total number of error cells that have a higher read programmed voltage (PV-r) than corrected programmed voltage (PV-c); and
determine the second error count e− that represents a total number of error cells that have a lower read programmed voltage (PV-r) than corrected programmed voltage (PV-c).

9. The system of claim 8, wherein the memory cells are configured such that the cell programmed voltages (PVs) are increased by read disturb.

10. The system of claim 8, wherein the memory controller is configured to identify a plurality of error cells by comparing, for each memory cell, the read programmed voltage (PV-r) with the corrected programmed voltage (PV-c).

11. The system of claim 8, wherein the read reclaim operation comprises copying valid values from the plurality of the memory cells to another plurality of memory cells.

12. The system of claim 8, wherein each memory cell is configured to store two binary bits of data and has four data states, 11, 01, 00, and 10 corresponding to four cell programmed voltages PV0-PV3, where PV0<PV1<PV2<PV3.

13. The system of claim 8, wherein each memory cell is configured to store three binary bits of data and has eight data states, 111, 011, 001, 000, 010, 110, 100, and 101 corresponding to four cell programmed voltages PV0-PV7, where PV0<PV1<PV2<PV3<PV4<PV5<PV6<PV7.

14. A method of controlling a storage system, the storage system including a plurality of memory cells arranged in blocks and a memory controller coupled to the plurality of memory cells for controlling data write and read in the plurality of memory cells, the method comprising:
selecting a block of memory cells, wherein each memory cell is programmed to a data state corresponding to one of multiple cell programmed voltages (PVs) from PV0 to PVN, where PV0<PV1< . . . <PVN, N being an integer;

reading multiple memory cells in the block to determine a programmed data state of each memory cell;

performing error correction decoding of the multiple memory cells to determine a corrected data state of each memory cell;

for each memory cell, determining a read programmed voltage (PV-r) corresponding to the programmed data state determined by reading the memory cell, and determining a corrected programmed voltage (PV-c) corresponding to the corrected data state determined by the error correction decoding;

identifying a plurality of error cells that have errors and a total number of error cells;

determining a first error count that represents a total number of error cells that have a higher read programmed voltage (PV-r) than corrected programmed voltage (PV-c);

determining a second error count that represents a total number of error cells that have a lower read programmed voltage (PV-r) than corrected programmed voltage (PV-c), wherein the total number of error cells comprises the first error count e+ and the second error count e−;

determining if the first error count is higher than the second error count;

determining if the total number of error cells is higher than a threshold error count; and upon determining that the first error count is higher than the second error count and the total number of error cells is higher than the threshold error count, performing a read reclaim operation of the selected block.

15. The method of claim 14, wherein the memory cells are configured such that the first error count is increased by read disturb and the second error count is decreased by read disturb.

16. The method of claim 14, wherein the read reclaim operation comprises copying valid values from the plurality of the memory cells to another plurality of memory cells.

17. The method of claim 14, wherein each memory cell is configured to store two binary bits of data and has four data states, 11, 01, 00, and 10 corresponding to four cell programmed voltages PV0-PV3, where PV0<PV1<PV2<PV3.

18. The method of claim 14, wherein each memory cell is configured to store three binary bits of data and has eight data states, 111, 011, 001, 000, 010, 110, 100, and 101 corresponding to four cell programmed voltages PV0-PV7, where PV0<PV1<PV2<PV3<PV4<PV5<PV6<PV7.

* * * * *